United States Patent [19]

Garrett et al.

[11] Patent Number: 5,519,169
[45] Date of Patent: May 21, 1996

[54] EMI GROUNDING CAP STRUCTURE FOR USE IN MOUNTING A PRINTED CIRCUIT BOARD ON A PLATED HOUSING BOSS

[75] Inventors: Robert Garrett; Thomas J. Kocis, both of Austin, Tex.

[73] Assignee: Dell USA, L.P., Austin, Tex.

[21] Appl. No.: 216,750

[22] Filed: Mar. 23, 1994

[51] Int. Cl.$^6$ .................................................. H02B 3/00
[52] U.S. Cl. ........................... 174/35 R; 174/356 C; 174/51; 361/800; 285/162
[58] Field of Search ................... 174/35 R, 356 C, 174/51, 138 G; 361/679, 712, 800, 704, 818; 439/374; 285/162

[56] References Cited

U.S. PATENT DOCUMENTS

| 2,825,042 | 2/1958 | Tollefson et al. | 339/253 |
| 3,222,093 | 12/1965 | Simmons | 285/162 |

FOREIGN PATENT DOCUMENTS

| 0332909 | 9/1984 | European Pat. Off. | 174/35 R |
| 0228397 | 10/1991 | Japan | 174/35 R |
| 4209228 | 7/1992 | Japan | 174/35 R |
| 2139827 | 11/1984 | United Kingdom | 174/35 R |

Primary Examiner—Kristine L. Kincaid
Assistant Examiner—Michael J. Cornelison
Attorney, Agent, or Firm—Henry N. Garrana; Mark P. Kahler; Michelle M. Turner

[57] ABSTRACT

A specially designed metal grounding cap is placed over a metal-plated housing boss upon which a printed circuit board is to be mounted by extending a screw through a hole in the circuit board and tightening the screw into a metal insert previously forced into the free end of the mounting boss. As the screw is tightened into the boss insert, an EMI grounding pad on the underside of the circuit board engages an end wall of the grounding cap and pushes it into forcible engagement with the inner end of the boss. The forcible engagement of the grounding cap end wall causes leg portions of the cap to pivot inwardly and engage portions of the plated boss side wall between the boss insert and the metal plated housing wall from which the boss inwardly projects. The installed grounding cap thus serves as a conductive bridge around plating disturbances on the boss, in the region of the forcibly installed insert therein, to maintain an EMI grounding path from the installed circuit board to the metal plating on the housing wall.

4 Claims, 2 Drawing Sheets

EMI GROUNDING CAP STRUCTURE FOR USE IN MOUNTING A PRINTED CIRCUIT BOARD ON A PLATED HOUSING BOSS

BACKGROUND OF THE INVENTION

The present invention generally relates to printed circuit board apparatus, and more particularly relates to apparatus and methods for effecting a grounding connection between a printed circuit board and an EMI-shielded housing boss upon which the circuit board is supported.

To provide an EMI-shielded enclosure for electronic equipment, such as printed circuit boards used in computers, plastic housings in which the electronics are operatively disposed are typically plated with a metallic material which is appropriately brought into contact with a grounding structure on the electronics. A low impedance contact between the electronics ground structure and the metallic EMI plating on the housing is required to provide satisfactory EMI shielding of the electronics disposed within the interior of the metal-plated housing.

A printed circuit board in a computer is typically secured within the computer housing by inserting a screw through an appropriate opening in the board and threading the screw into an internally threaded metal insert disposed within an inner end portion of a hollow cylindrical boss projecting inwardly from an exterior wall of the housing. The interior side surface of the housing wall has a metallic EMI plating thereon that extends from the wall along the outer side surface and inner end surface of the boss.

Tightening of the screw into the boss insert is designed to bring the screw head into contact with a grounding pad formed around the circuit board screw opening on one side of the board, and also bring a grounding pad formed around the circuit board screw opening on the other side of the board into contact with the EMI plating material on the inner end of the boss. In this manner, an EMI grounding path is formed from the circuit board grounding pads through the exterior boss plating material to the plating material extending along the inner side of the plastic housing wall from which the integrally molded mounting boss inwardly projects.

In installing the threaded insert within the plated mounting boss before the circuit board is connected thereto, the insert is placed on the inner end of the boss and forcing the boss coaxially into the inner end of the boss while applying heat or ultrasonic vibration to the insert, thereby causing the plastic boss material to "flow" and permit forced insertion of the insert into the boss interior. This forced placement of the insert into the plastic boss interior often disturbs the conductivity of the boss plating, around an outer portion of the boss that receives the insert, due to the lateral expansion of the boss caused by its receipt of the insert. The conductivity disturbance of the boss plating in this outer portion thereof is typically manifested by a cracking of the boss plating which increases the impedance in the EMI shielding conductivity path between the installed circuit board and the EMI plating on the interior side surface of the housing wall from which the boss inwardly projects.

As can readily be seen from the foregoing, it would be highly desirable to provide an improved circuit board-to-housing boss connection structure that essentially eliminates this EMI shielding disturbance problem. It is accordingly an object of the present invention to provide such improved connection structure.

SUMMARY OF THE INVENTION

In carrying out principles of the present invention, in accordance with a preferred embodiment thereof, apparatus is provided for mounting a printed circuit board on the inner end of a metal plated plastic mounting boss projecting inwardly from the metal plated inner side of a plastic housing wall. The apparatus comprises an internally threaded insert member axially and forcibly positionable within an inner end portion of the mounting boss, and a fastening member extendable through the printed circuit board and threadable into the positioned insert member to draw the circuit board toward the inner end of the boss.

The apparatus also comprises electrically conductive cap means, positionable over the boss prior to the threading of the fastening member into the positioned insert member, for forming, in response to tightening of said fastening member into the positioned insert member, an electrical grounding path extending between the printed circuit board and an outer side wall portion of the boss disposed between the positioned insert and the housing wall. In this manner the installed cap means form a conductive "bridging" path which bypasses the plating damage area created by the forcible insertion into the boss of the threaded insert member.

In a preferred embodiment thereof the cap means have an end wall portion deformable between the printed circuit board and the inner boss end wall in response to tightening of the fastening member into the positioned insert member, and a side wall portion deflectable into engagement with an outer side portion of the boss, between the positioned insert member and the housing wall, in response to deformation of the cap means end wall portion between the printed circuit board and the inner boss end wall.

Representatively the cap means are defined by a sheet metal grounding cap member having a generally annular end wall having an axially raised outer peripheral portion. Extending axially away from this raised peripheral portion are a circumferentially spaced plurality of leg portions that slop axially away and radially outwardly from the peripheral portion and have radially inwardly bent outer ends. Prior to the securement of the printed circuit board to the boss, this sheet metal cap is placed over the boss. When the fastening member is tightened into the insert within the boss, the raised peripheral end wall portion of the cap member is flattened between the circuit board and the inner end of the boss. This flattening of the cap member end wall portion inwardly pivots the cap member leg portions to forcibly engage their outer end portions with the side of the plated boss, thereby creating an EMI grounding path from the circuit board past the disturbed plating area of the boss to the metallic EMI plating formed on the housing wall from which the mounting boss inwardly projects.

DETAILED DESCRIPTION

Figure 1:
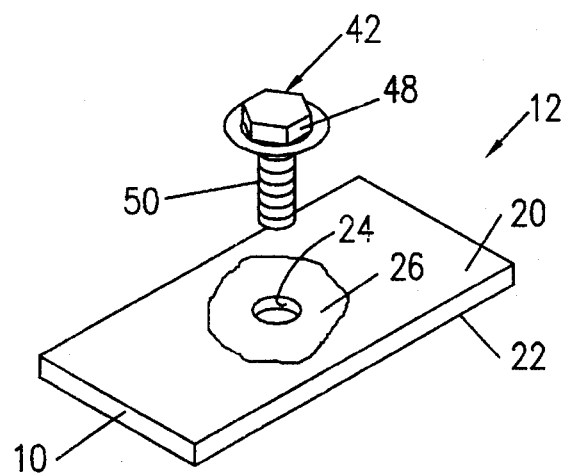
FIG. 1 is a simplified exploded perspective view of a circuit board-to-housing attachment system incorporating a specially designed EMI grounding cap embodying principles of the present invention.
Figure 1:
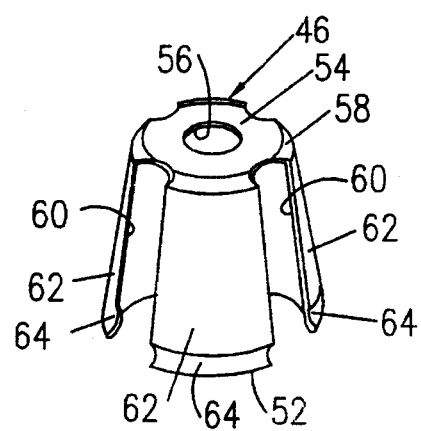
Figure 1:
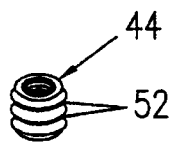
Figure 1:
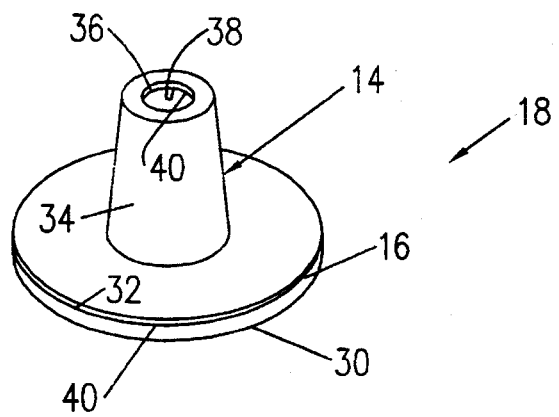

Perspectively illustrated in FIG. 1 is a portion 10 of a representative printed circuit board 12, shown in simplified form, which is to be mounted on a hollow, generally cylindrical plastic boss 14 molded integrally with a plastic exterior wall portion 16 of a plastic housing 18 (representatively a computer housing) within the interior of which the circuit board will ultimately be disposed. The printed circuit board 12 has top and bottom sides 20 and 22, and a circular mounting hole 24 extending transversely therethrough. Circumscribing the mounting hole 24 are annular electrically conductive grounding pads 26,28 (see FIG. 2) respectively formed on the top and bottom sides 20,22 of the circuit board and conductively coupled to the ground plane (not shown) of the circuit board.

The plastic outer housing wall 16 has an outer side surface 30, and an inner side surface 32 from which the integrally molded plastic mounting boss 14 inwardly projects in an upward direction as viewed in FIG. 1. Boss 14 has an outer side surface 34, a top or inner end surface 36, and a central circular opening 38 extending axially into the boss through its inner end surface 36. The inner housing wall surface 32 and the side and inner end surfaces 34,36 of the boss are conventionally coated with a thin layer of a metallic EMI plating material 40 prior to the connection of the printed circuit board 12 to the inner end 36 of the plastic mounting boss 14 in a manner subsequently described herein.

The printed circuit board 12 is mounted on the inner end of the metal-coated plastic boss 14 using a connection assembly including a metal mounting screw 42, an internally threaded tubular metal insert member 44, and a specially designed metal grounding cap member 46 embodying principles of the present invention. Screw 42 has a head portion 48 and a threaded body portion 50. The internally threaded tubular metal insert 44 has an axially spaced plurality of annular exterior locking ribs 52 thereon.

Figure 2:
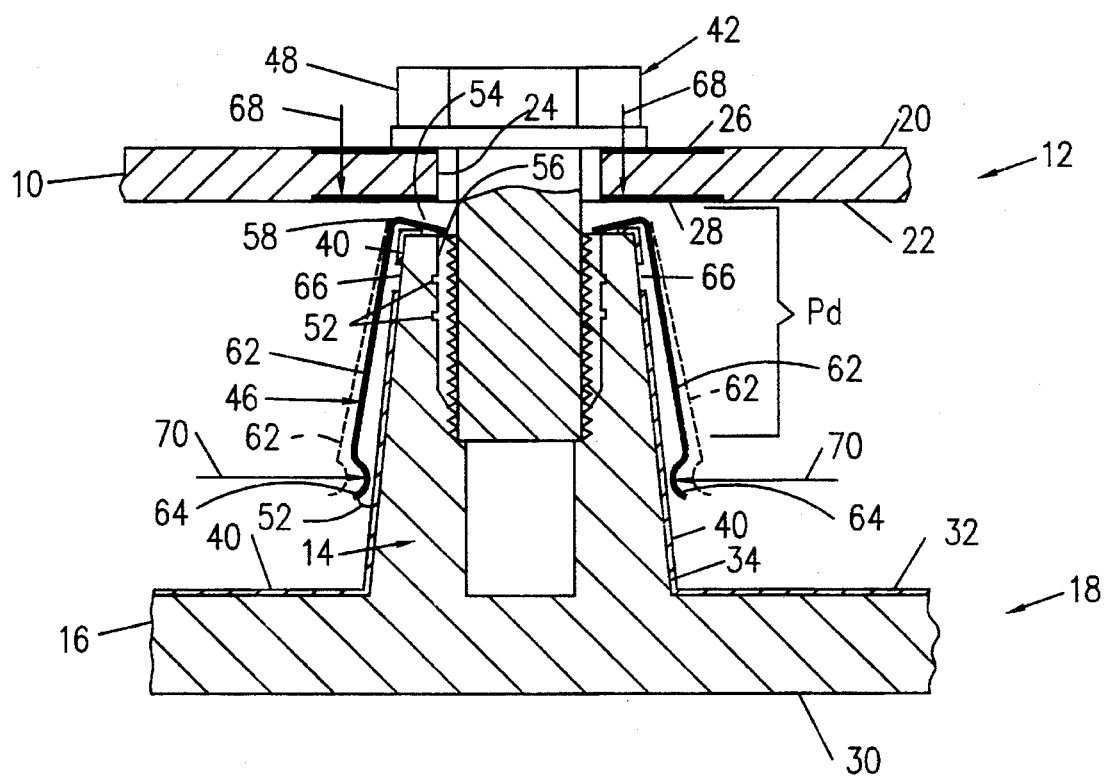
FIG. 2 is an enlarged scale cross-sectional view through the attachment system in its assembled state.

Referring now to FIGS. 1 and 2, the metal grounding cap member 46 has a hollow, generally cylindrical configuration, an open lower end 52, and an annular upper end wall 54 with a central circular opening 56 therein and an upwardly projecting outer peripheral portion 58. A circumferentially spaced series of vertically extending cutout areas 60 are formed in the side wall portion of the cap member, extending from the lower end 52 through the raised upper end peripheral portion 58, to define a plurality of circumferentially spaced vertical leg portions 62 on the cap member. From its juncture with the upper end wall each of the leg portions 62 slopes downwardly and radially outwardly at a slight angle relative to vertical, and each leg portion 62 has an inwardly bent lower end portion 64.

After the plastic housing wall portion 16 and its associated mounting boss have the metallic EMI plating 40 applied thereto, but before the circuit board portion 10 is mounted on the inner end of the boss 14, the metal insert 44 is coaxially placed in the interior of the boss 14 in a conventional manner by placing the insert on the boss, and applying downward pressure on the insert while also applying heat or ultrasonic vibration thereto to cause the plastic in an upper end portion of the boss to flow and permit forced entry of the insert into its operatively locked position within the boss as shown in FIG. 2.

Referring now to FIG. 2, this forced placement of the internally threaded metal insert 44 into the boss 14 tends to disturb the EMI plating 40 along an area Pd thereof generally corresponding to the inner end portion of the boss that receives the insert 44. This plating disturbance is caused by the lateral expansion of the inner end portion of the boss that forcibly receives the insert 46, and typically manifests itself by causing in the plating 40, in the disturbed area Pd thereof, a cracked region 66. Representatively, the cracked region 66 extends completely around the boss, thereby creating an EMI conductivity break between top and bottom end portions of the boss.

In the conventional attachment of the circuit board 12 to the boss 14, after the insert 44 is forced into the boss 14 as described above, the mounting screw body 50 is passed downwardly through the circuit board mounting hole 24 and screwed into the insert 44 to thereby bring the head 48 of the screw 42 into forcible contact with the top grounding pad 26 and bring the bottom grounding pad 28 into forcible contact with the conductively plated top or inner end of the mounting boss 14. This contact between the grounding pad 28 and the plated top end of the boss 14 is intended to ground the circuit board, via the plating material 40 on the side and inner end of the boss, to the plating material 40 on the inner side 32 of the housing wall 16.

However, due to the plating crack 66, this intended grounding path is broken. The present invention uniquely, easily and inexpensively eliminates this problem by the use of the metal grounding cap 46 which serves as a conductive "bridge" across the crack 66. Referring now to FIG. 2, before the circuit board 12 is screwed onto the top end of the boss 14, the grounding cap 46 is placed over the inner end of the boss 14 so that the upper end wall 54 of the grounding cap rests on the top end of the plated boss 14.

With the grounding cap 46 initially placed on the boss 14 in this manner, the grounding cap is in its dotted line position shown in FIG. 2, with the cap leg portions 62 being spaced somewhat outwardly apart from the outer side surface of the boss 14, and the inwardly bent lower end portions 62 of the cap member 46 being positioned below the lower end of the insert 50 and its associated plating disturbance zone Pd.

When the circuit board is subsequently attached to the plated mounting boss 14 the screw body 50 is passed downwardly through the circuit board hole 24 and the top cap end hole 56 and screwed into the threaded metal insert 44. The tightening of the screw 42 into the insert 44 causes the bottom side grounding pad 28 on the circuit board 12 to forcibly engage and downwardly deflect the upwardly projecting peripheral top end portion 58 of the grounding cap 46, as indicated by the arrows 68 in FIG. 2.

This downward deflection of the peripheral top end portion 58 correspondingly causes the inwardly bent lower ends 64 of the cap leg portions 62 to be pivoted inwardly from their dotted line positions to their solid line positions, in which they engage the plated outer side of the boss 14 below the plating crack 66, as indicated by the arrows 70 in FIG. 2. Accordingly, with the screw 42 tightened into the insert 44, the metal in the installed grounding cap 46 forms an electrically conductive EMI grounding path from the circuit board grounding pad 28 downwardly around the plating crack 66 to the plated side surface of the mounting boss 14. This provides a simple and inexpensive solution to the problem caused by boss plating disturbance disposed in the zone Pd and caused by the forcible placement of the insert 44 into the boss 14.

The foregoing detailed description is to be clearly understood as being given by way of illustration and example only, the spirit and scope of the present invention being limited solely by the appended claims.

What is claimed is:

1. Computer apparatus Comprising:

a plastic housing having an exterior wall from which a hollow plastic mounting boss inwardly projects, the interior side of said exterior housing wall and the external surface of said mounting boss being coated with a metallic EMI plating material;

an internally threaded insert member force-fitted into an inner end portion of said mounting boss;

a printed circuit board positioned over the inner end of said mounting boss and having a mounting hole aligned with said inner end;

a fastening member extending through said mounting hole and threaded into said insert member; and a metal grounding cap positioned over said mounting boss, said metal grounding cap having:

- a generally annular end wall portion disposed between said printed circuit board, circumscribing said fastening member, and being axially pressed and deformed between said printed circuit board and said inner end of said mounting boss, and
- a side wall section extending generally axially from said end wall portion toward said exterior housing wall, said side wall section having an outer end portion deflected into and held in contact with the side of said mounting boss, between said insert member and said exterior housing wall, by the deformation of said end wall portion.

2. The computer apparatus of claim 1 wherein:

said annular end wall portion of said metal grounding cap has an axially raised peripheral area, and said side wall section of said metal grounding cap has a circumferentially spaced plurality of slots disposed therein and axially extending from said outer end portion of said side wall section into said axially raised peripheral area, said slots dividing said side wall section into a circumferentially spaced series of axially extending leg portions, each of said leg portions having an inwardly bent outer end portion engaged with the side of said mounting boss between said insert member and said exterior housing wall.

3. A method of mounting a printed circuit board on a hollow, generally tubular plastic boss projecting inwardly from an exterior plastic housing wall, the interior side surface of the wall and the exterior of the boss being coated with a metallic EMI plating material and the printed circuit board having a mounting hole therein, said method comprising the steps of:

forcibly placing a threaded insert member into an inner end portion of the boss;

providing a metal grounding cap member having an end wall portion with a central opening therein, and a generally tubular body portion connected to said end wall portion and having an open outer end portion spaced apart from said end wall portion;

placing said grounding cap member on said boss in a manner such that said end wall portion covers and engages the inner end of the boss with said cap member body portion outwardly circumscribing the boss with the cap member outer end portion being positioned between said insert member and the exterior housing wall;

extending a fastening member through the circuit board mounting hole and said central opening of said grounding cap member end wall portion; and tightening the fastening member into said insert member to deform said cap member end wall portion between the printed circuit board and the inner end portion of the boss and responsively deflect said cap member outer end portion inwardly into engagement with the side of the boss.

4. The method of claim 3 wherein:

said grounding cap member end wall portion is of a generally annular configuration and has an axially raised peripheral portion, and said body portion of said grounding cap member has a circumferentially spaced plurality of slots disposed therein and axially extending from said cap member outer end portion into said raised peripheral portion to thereby form on said body portion a circumferentially spaced series of axially extending leg portions, said leg portions having inwardly bent outer end portions, and said tightening step is performed in a manner axially deforming said raised peripheral portion of said cap member end wall portion and responsively pivoting said leg portion outer end portions into engagement with the side of said boss.

* * * * *